(12) United States Patent
Sherry et al.

(10) Patent No.: US 10,698,000 B1
(45) Date of Patent: *Jun. 30, 2020

(54) WAVEGUIDE INTEGRATED TESTING

(71) Applicant: Johnstech International Corporation, Minneapolis, MN (US)

(72) Inventors: Jeffrey Sherry, Savage, MN (US); Cory Kostuchowski, Wyoming, MN (US)

(73) Assignee: Johnstech International Corporation, Minneapolis, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/392,983

(22) Filed: Apr. 24, 2019

Related U.S. Application Data

(63) Continuation of application No. 15/228,355, filed on Aug. 4, 2016, now Pat. No. 10,274,515.

(60) Provisional application No. 62/279,882, filed on Jan. 18, 2016, provisional application No. 62/202,344, filed on Aug. 7, 2015.

(51) Int. Cl.
*G01R 1/04* (2006.01)

(52) U.S. Cl.
CPC ............ *G01R 1/045* (2013.01); *G01R 1/0466* (2013.01)

(58) Field of Classification Search
CPC .... G01R 1/045; G01R 1/0466; G01R 1/0408; G01R 1/0433
USPC ....... 324/750.26, 756.02; 439/607.19, 607.4, 439/607.17, 607.28, 788, 840, 867
See application file for complete search history.

(56) References Cited

U.S. PATENT DOCUMENTS

| 5,420,506 | A | * | 5/1995 | Lin ........................ | G01R 1/045 324/750.25 |
| 6,380,752 | B1 | * | 4/2002 | Irino ...................... | G01R 1/045 324/750.26 |
| 6,844,749 | B2 | * | 1/2005 | Sinclair ................ | G01R 1/0466 324/755.05 |
| 6,937,045 | B2 | * | 8/2005 | Sinclair ................ | G01R 1/0466 324/755.05 |

(Continued)

FOREIGN PATENT DOCUMENTS

| WO | WO 2017/062291 | 4/2017 | |
| WO | WO-2017062291 A1 * | 4/2017 | ......... G01R 31/2822 |

OTHER PUBLICATIONS https://www.rotorclip.com/wave_spring_advantage1.php, dated Aug. 4, 2016.

(Continued)

*Primary Examiner* — Patrick Assouad
*Assistant Examiner* — Sean Curtis
(74) *Attorney, Agent, or Firm* — Hamre, Schumann, Mueller & Larson, P.C.

(57) ABSTRACT

A structure and method for providing a housing which includes a high frequency (HF) connection between a device under test (DUT) having a wave port 20 and a load board via a waveguide structure. The waveguide includes a wave insert 42, a waveguide adapter 24 and a conductive compliant member 40 which maintains bias between the adapter 24 and the DUT HF port 20 while also maintaining an RF shield despite the variable height of the DUT wave port. The adapter may also include a projection 64 which is received in a recess in the waveguide so that the shielding between the waveguide and adapter has full integrity.

16 Claims, 18 Drawing Sheets

(56) References Cited

U.S. PATENT DOCUMENTS

| | | | | |
|---|---|---|---|---|
| 7,601,009 B2* | 10/2009 | Di Stefano | | G01R 1/0466 439/73 |
| 7,833,023 B2* | 11/2010 | Di Stefano | | G01R 1/0466 439/73 |
| 8,044,673 B1* | 10/2011 | Burgyan | | G01R 1/0483 324/750.16 |
| 9,151,778 B2* | 10/2015 | Jeong | | G01R 1/06772 |
| 9,435,855 B2* | 9/2016 | Lewinnek | | G01R 31/2889 |
| 9,588,173 B2* | 3/2017 | Isaac | | G01R 1/045 |
| 9,817,025 B2* | 11/2017 | Isaac | | G01R 1/045 |
| 9,863,976 B2* | 1/2018 | Sarhad | | G01R 31/31905 |
| 9,933,455 B2* | 4/2018 | Song | | G01R 1/045 |
| 10,031,160 B2* | 7/2018 | Isaac | | G01R 1/045 |
| 10,037,933 B2* | 7/2018 | Treibergs | | G01R 1/0483 |
| 10,067,161 B2* | 9/2018 | Harada | | G01R 1/0466 |
| 10,274,515 B1* | 4/2019 | Sherry | | G01R 1/045 |
| 2003/0042883 A1* | 3/2003 | Thurston | | G01R 1/06772 324/72.5 |
| 2010/0188112 A1* | 7/2010 | Yoshida | | G01R 1/045 324/755.01 |
| 2010/0244872 A1* | 9/2010 | Yoshida | | G01R 1/045 324/754.03 |
| 2011/0201221 A1* | 8/2011 | Kobayashi | | G01R 1/0466 439/331 |
| 2012/0068316 A1* | 3/2012 | Ligander | | H01L 23/49503 257/664 |
| 2013/0065455 A1* | 3/2013 | Kawata | | G01R 1/0483 439/700 |
| 2015/0168450 A1* | 6/2015 | Wooden | | G01R 1/07371 324/756.02 |
| 2015/0168486 A1* | 6/2015 | Isaac | | G01R 1/045 324/756.02 |
| 2015/0295305 A1* | 10/2015 | Herbsommer | | H01Q 19/108 343/873 |
| 2015/0369840 A1* | 12/2015 | Treibergs | | G01R 1/0483 324/755.05 |
| 2017/0059611 A1* | 3/2017 | Lesnikoski | | G01R 1/045 |
| 2017/0102409 A1* | 4/2017 | Sarhad | | G01R 1/045 |
| 2017/0160310 A1* | 6/2017 | Isaac | | G01R 1/045 |
| 2018/0031606 A1* | 2/2018 | Isaac | | G01R 1/045 |
| 2018/0196096 A1* | 7/2018 | Jeong | | G01R 1/045 |
| 2018/0259574 A1* | 9/2018 | Zanati | | G01R 31/2886 |

OTHER PUBLICATIONS

Devlin, Liam; The Future of MM-Wave Packagain, Microwave Journal, 57, 24-38, Feb. 2014, (Year 2014).

* cited by examiner

WAVEGUIDE INTEGRATED TESTING

CROSS REFERENCE AND INCORPORATION BY REFERENCE

The following application is hereby incorporated by reference in its entirely: U.S. Ser. No. 14/211,974 filed 14 Mar. 2014 entitled Integrated Circuit Contact Test Apparatus with and Method of Construction.

BACKGROUND

Field of the Disclosure

The present disclosure is directed to equipment for testing integrated circuits and semiconductors.

Description of the Related Art

As microcircuits continually evolve to be smaller and more complex, the test equipment that tests the microcircuits also evolves. There is an ongoing effort to improve microcircuit test equipment, with improvements leading to an increase in reliability, an increase in throughput, and/or a decrease in expense.

Mounting a defective microcircuit on a circuit board is relatively costly. Installation usually involves soldering the microcircuit onto the circuit board. Once mounted on a circuit board, removing a microcircuit is problematic because the very act of melting the solder for a second time ruins the circuit board. Thus, if the microcircuit is defective, the circuit board itself is probably ruined as well, meaning that the entire value added to the circuit board at that point is lost. For all these reasons, a microcircuit is usually tested before installation on a circuit board.

Each microcircuit must be tested in a way that identifies all defective devices, but yet does not improperly identify good devices as defective. Either kind of error, if frequent, adds substantial overall cost to the circuit board manufacturing process, and can add retest costs for devices improperly identified as defective devices.

Microcircuit test equipment itself is quite complex. First of all, the test equipment must make accurate and low resistance temporary and non-destructive electrical contact with each of the closely spaced microcircuit contacts. Because of the small size of microcircuit contacts and the spacings between them, even small errors in making the contact will result in incorrect connections. Connections to the microcircuit that are misaligned or otherwise incorrect will cause the test equipment to identify the device under test (DUT) as defective, even though the reason for the failure is the defective electrical connection between the test equipment and the DUT rather than defects in the DUT itself.

A further problem in microcircuit test equipment arises in circuits which run at high frequencies. Prior art test systems cannot handle these frequencies reliably or without signal losses. Furthermore, shielding of high frequency (HF) ports interference with adjacent ports.

BRIEF SUMMARY

The summary below is not intended to define the scope of invention but provide a convenient way for the reader to understand some of the concepts in the entire document.

There is disclosed a test socket for making electrical connection between an integrated circuit device under test (DUT) having a high frequency (HF) wave port located on the DUT at a height above the surface of the DUT, and a plurality of contact points on the surface of the DUT, comprising any or all of the following elements each to be interpreted as broadly as possible:

a housing having a top wave port adapter portion and wave port adapter, said wave port insert portion being in up and down sliding engagement with the housing and the DUT wave port and having a bottom surface sized to engage a recess in said bottom so that the top and bottom overlap during up and down movement therebetween, said housing being configured to bring said wave port insert portion into proximate contact with said DUT wave port;

said adapter portion including a HF shielding elastomeric biasing compliance member positioned to bias said insert portion resiliently into said port on the DUT, so that when the housing is brought adjacent the DUT, contact is made with the plurality of contact points on the DUT and the insert portion makes biased contact with the DUT wave port, despite variations in the height of the wave port above the surface of the DUT.

Also disclosed is wherein the elastomeric bias compliance member is a resilient metal spring.

Also disclosed is wherein the elastomeric bias compliance member is a resilient metal coated spring.

Also disclosed is wherein the elastomeric bias compliance member is a resilient helical wound conductive spring.

Also disclosed is wherein the elastomeric bias compliance member is a resilient a spring formed into a double helix and electrically conductive.

Also disclosed is wherein the insert adapter includes a circumferential recess for receiving a portion of said compliance member.

Also disclosed is wherein the housing includes a circumferential recess for receiving a portion of said compliance member.

Also disclosed is wherein the insert adapter includes a coaxial shield member located on a surface of said adapter facing said DUT and coaxially with said compliance member; said shield joining said DUT and adapter when the two are brought together.

Also disclosed is wherein said compliance member is a cylindrical conductive elastomeric tube.

Also disclosed is wherein the wave port on the DUT has an inner periphery and wherein said insert adapter extends into said inner periphery.

Also disclosed is wherein said adapter includes a plurality of apertures and the housing includes dowel pins sized to be slideably received within said apertures, whereby the inert adapter may move along said dowel pins in response to contact with the DUT wave port.

Also disclosed is wherein said compliant member includes a plurality of stacked non planar resilient rings.

Also disclosed is wherein the compliant member includes a plurality so spring pins extending from aligned side by side into a circumferential resiliently supporting the adapter.

Also disclosed is wherein said compliance member is a cylindrical conductive elastomeric tube having a bottom edge and a conductive circular washer joined thereto to create a base to said tube.

Also disclosed is a method of maintaining a RF shielding path between a DUT and test housing device, where the housing is capable of up and down movement in response to inserting of the DUT into the housing, comprising any or all of the steps below in any order:

forming a two part housing of an upper adapter part and a lower waveguide part, the upper part configured to engage a port on the DUT at its top end and slideably engage the waveguide at its lower end, while maintaining an RF shielded path during sliding;

inserting an elastomeric conductive compliant member within said waveguide and up into the adapter to bias the upper part into said DUT port.

Also disclosed is test socket, attachable to a load board, for making electrical connection between an integrated circuit device under test (DUT) having connection points and a high frequency (HF) wave port, comprising any or all of the following elements interpreted broadly:

a housing having a top adapter portion and bottom guide portions, said top portion being in up and down sliding engagement with DUT wave port and having a bottom surface sized to engage a recess in said bottom so that the top and bottom overlap during up and down movement therebetween, said bottom part having a circumferential recess;

a shielding elastomeric bias element received partly within said recess and partly within said top portion to provide a continuous shield between the top and bottom portion and for simultaneously biasing the top portion against said DUT;

a calibration dummy DUT sized to be received in place of said DUT and including a high frequency source input port and a dummy output port configured to be aligned with said high frequency port, so that a known a HF signal of known parameters can be inputted through said input port and a signal parameter measurement can be made at said load board, thereby providing a calibration signal.

DETAILED DESCRIPTION

Integrated circuits operate at different speeds. Some devices which operate at 60+ GHz need to be tested and conventional test systems that use coax, contacts or microstrip or stripline structures to interface to devices under test are extremely lossy at these frequencies. Examples of such devices are chips which have microwave/radar transceivers, such as for automotive auto braking systems. The present disclosure provides a compliant waveguide interface to these devices which can provide a high frequency interface to these devices, because previous testing methods/equipment structures do not provide compliance/solid contact to the chip while still providing a solid RF return path for production testing when accounting for package tolerancing.

In this disclosure there is shown a waveguide with properties to interface to these devices by adding compliance.

Figure 1:
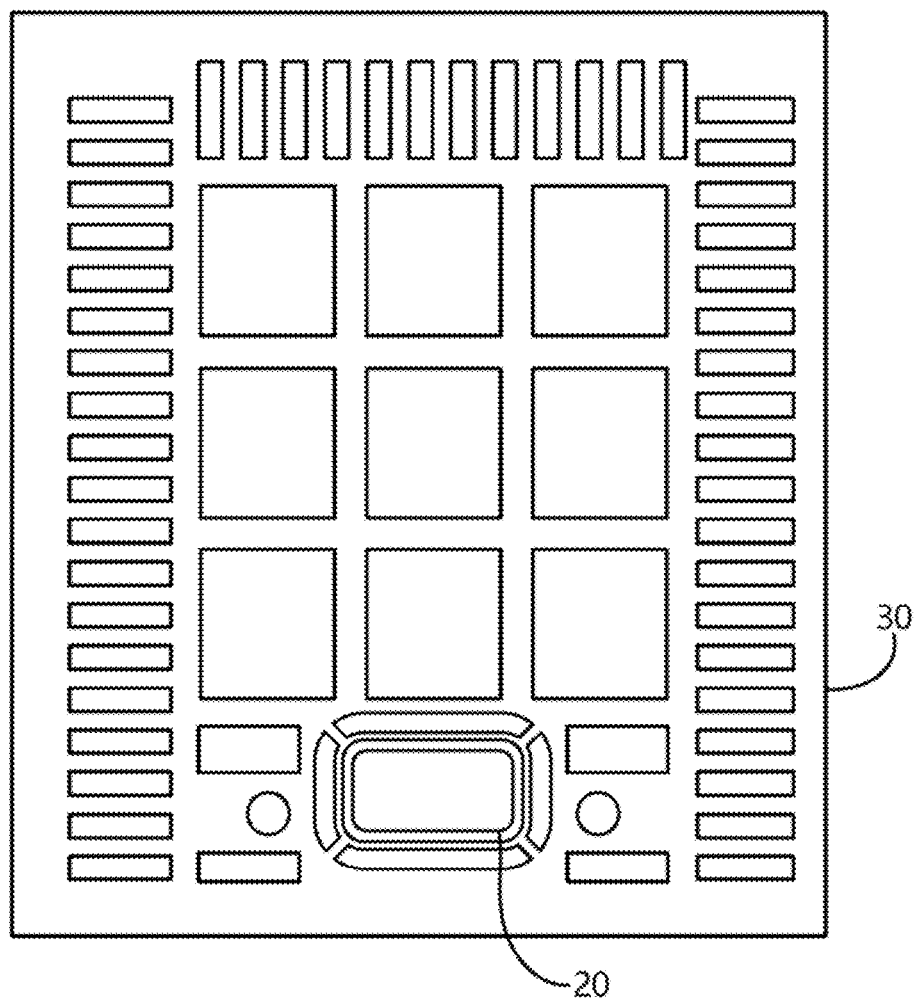
FIG. 1 is a bottom view of a device (IC) with a high frequency port.
Figure 2:
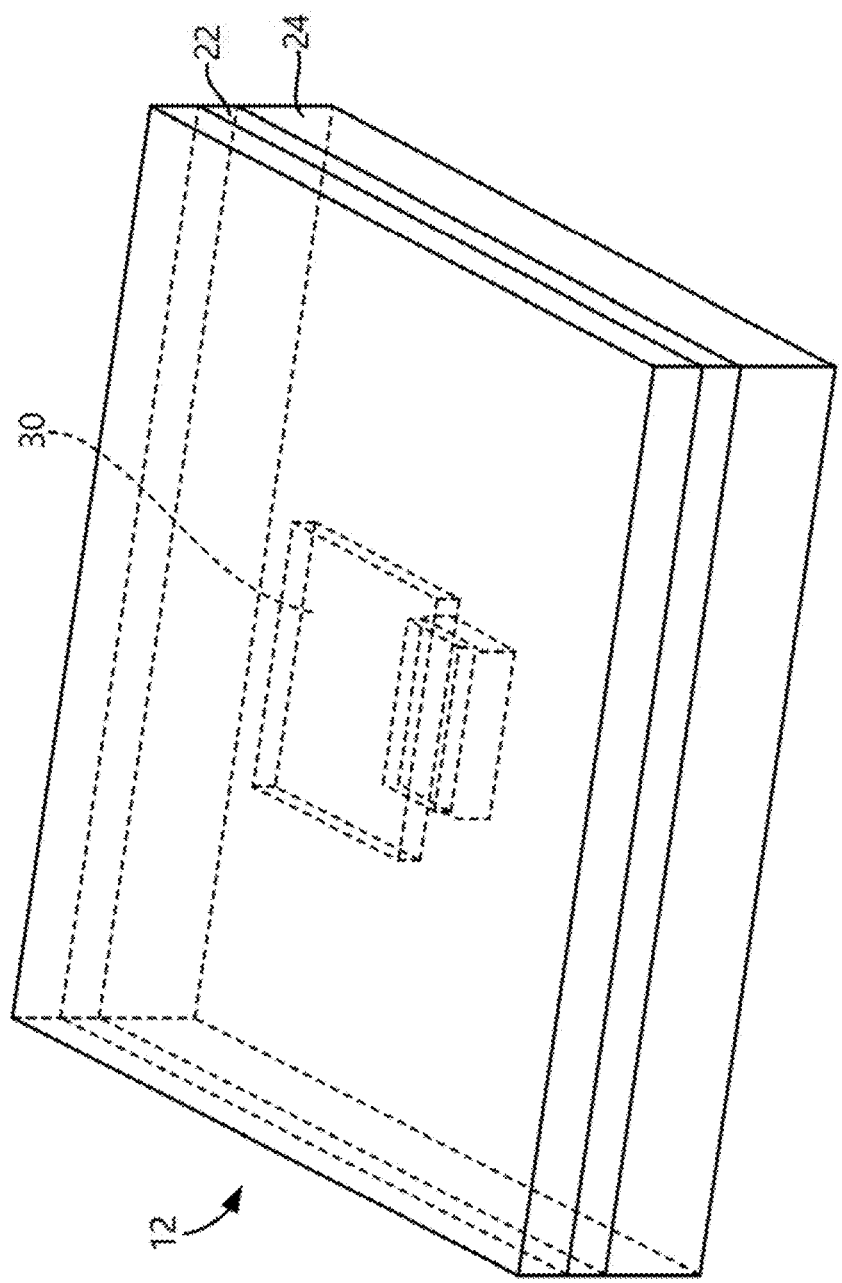
FIG. 2 is a perspective semi-transparent view of the housing with a device under test (DUT).

See FIG. 1 for a bottom view of a QFN device 30 (device under test, or DUT) operating at 75 to 86 GHz with such a HF interface. Note the embodiments show only rectangular waveguide port/openings 20. Other shapes are possible including square, circular and even any other exotic/irregular/non-symmetrical opening shapes surrounded by metal to form a waveguide.

The contactor/test socket 12, in some embodiments can convert a lower waveguide band structure to a higher frequency band structure if the two waveguide structures overlap in frequency by effectively converting the device interface structure to a higher band structure in the contactor. The waveguide port could be incorporated into a higher performance metal housing with coaxial like contacts.

The adapter waveguide piece on the bottom of the load board would interface to a standard waveguide flange with dowel pins and tapped holes for screws. Based on analysis it is best for this structure to go to the next highest waveguide band to optimized insertion loss. This would also result in the waveguide opening being smaller than the opening on the device so tolerancing and alignment is less critical. The waveguide insert would then have flanges which insert, or at least contact on the inner periphery of the waveguide port on the DUT.

In other words, for even better performance the waveguide port of the insert adapter 42 (i.e. the distal most port of the adapter) could fit inside cavity 20 on device to improve test results. For adding compliance to match the waveguide compliance to the compliance of for example, the ROL®100A (made by Johnstech International Corporation) Performance Plus™ housing (metal housing) may have a coaxial shield 45 (FIGS. 9, 19) using like Torlon® inserts or other suitable material to provide 50 Ohm connections on sub 30 GHz RF lines) and a conductive/compliant member. The compliant member can be a wave spring, helical or double helical spring, coil spring, array of spring pins formed in a vertical side by side cylindrical alignment, or pogo pins similarly aligned, conductive elastomer, compressible metal, elastomer with embedded conductive balls or elastomer material with embedded conductive wires or any material that is conductive and compliant like Invisipin® made by R&D Altanova to provide a good conductive path between the waveguide insert and the waveguide adapter around the waveguide opening.

Figure 14:
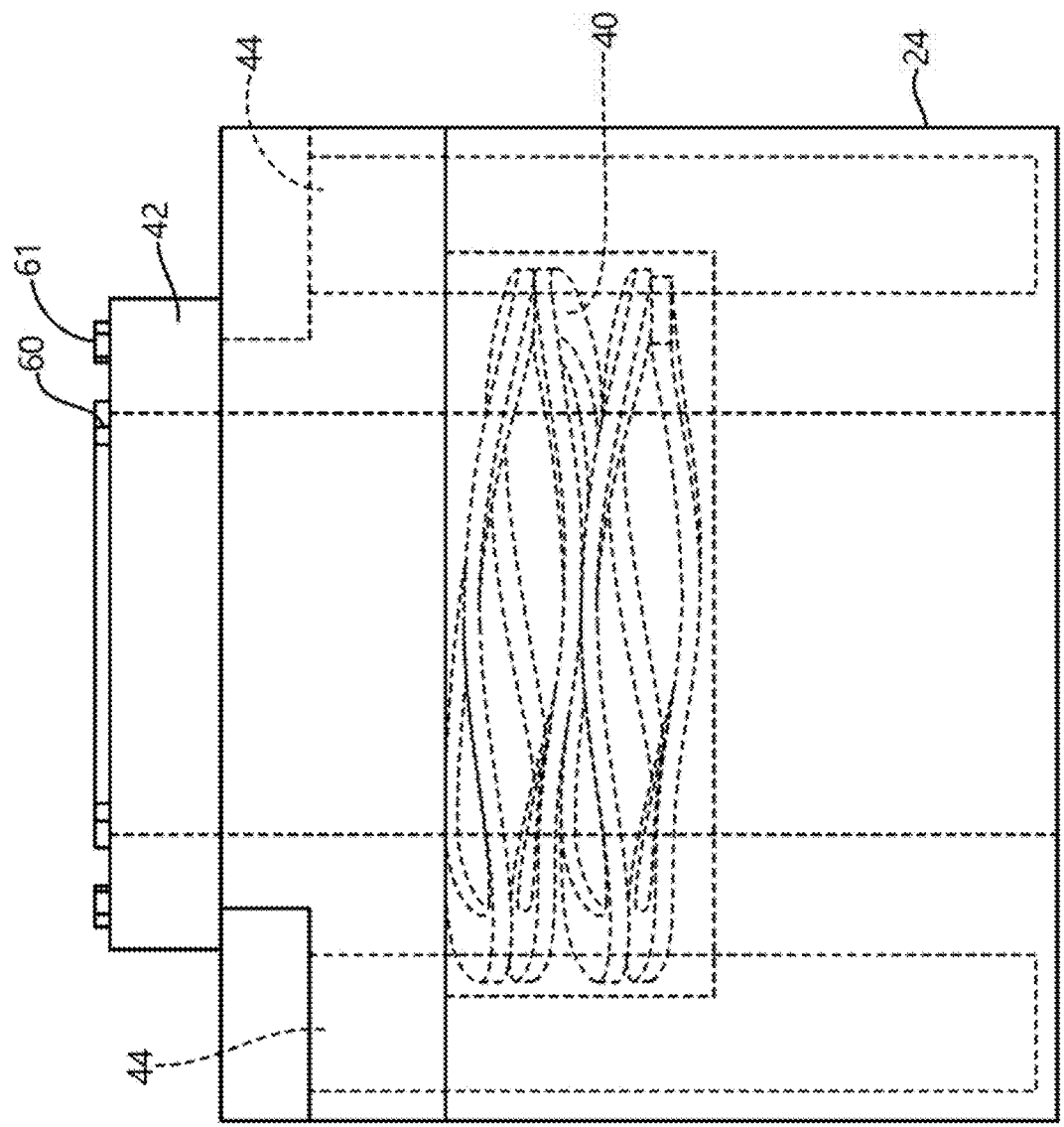
FIG. 14 is side plan semi-transparent view of the subject matter in FIG. 13.

The complaint/compliance member 40 can be characterized as a shielding elastomeric bias element. This means that it varies in height in compliance along with the varying distance between the wave port on the DUT and the wave guide insert 42 which has a like wave guide receiving port (not numbered). The compliance, i.e. height adjustability compensates for manufacturing tolerances in the DUT wave port height and prevents damaging impact with the port, when the other pins/pads on the DUT come into contact with the pins 28. Thus, the compliant member serves two functions: 1) it is resilient and 2) it provides a wave guide shield to prevent RF losses. The compliant member can be in many forms. The preferred is shown in FIG. 14 as a helix, double helix (interleaved helical coils in opposite directions) or spiral of metal or other metalized/conductive material that compresses. It can also be a series of non-planar rings stacked or bonded together to create a coil like structure. At its top and bottom surfaces it is preferably planar to maximize contact with the housing 22 and insert 42 or adapter 24. The housing 22 may be metal or metalized for this purpose. The tightness of the windings of the helix is determined by the degree of shielding required. Alternative embodiments are shown, such as the boot in FIGS. 16*a/b*. A spring device which may be modified for this purpose is sold by Rotor Clip Company, Inc. of Somerset, N.J., USA. See https://www.rotorclip.com/wave_spring_advantage1.php.

The housing has a top adapter portion and bottom guide portions, said top portion being in up and down sliding engagement with the DUT HF port and having a bottom surface sized to engage a recess in said bottom guide portion so that the top and bottom portions of the guide overlap during up and down movement therebetween. The overlap insures solid RF shielding. The bottom part may have a circumferential recess for receiving the compliant member. Of course top and bottom are just relative terms and do not mean actual top or bottom.

The shielding elastomeric bias element/compliant member is preferably partially received partly within said recess and partly within said top portion to provide a continuous shield between the top and bottom portion and for simultaneously biasing the top portion against the DUT Materials that can be repeatedly compressed down to for example, 0.1 mm would work in this application. This included the possibility of a metal plated Kapton® tubing shaped vaguely similar in size and function to what is used in medical stents, except the Kapton® tubing would allow repeatable compressions to assure contact between device waveguide ground and fixture ground. This creates a gasketing effect, sealing the port and waveguide against leakage. To make the gasketing work it needs to have as much compliance/resilience or more as the solid RF connections need on the rest of the device. This is approximately 0.1 mm of compliance.

Figure 12:
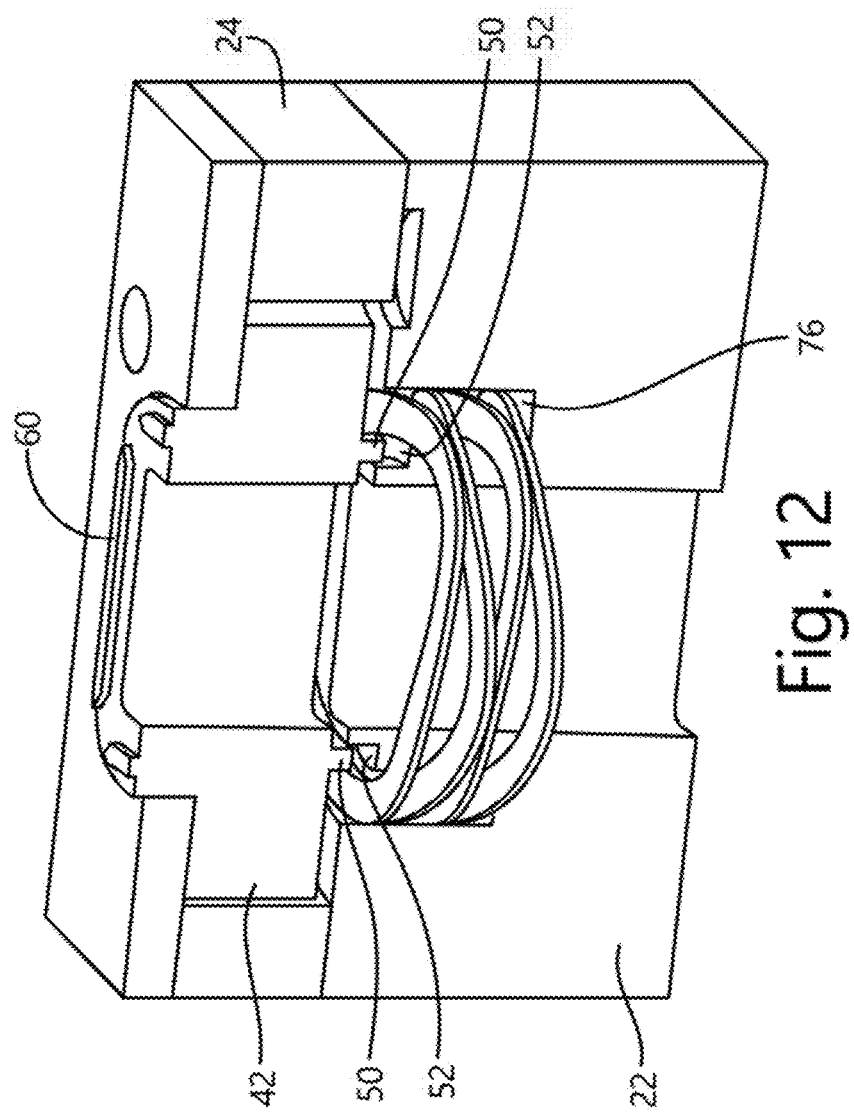
FIG. 12 is close up perspective view of the subject matter in FIG. 11.

FIGS. 9-12 show alternative embodiments for the compliant members. To account for different compliant member heights and different thickness of load boards, the floor of the waveguide adapter 24 that houses the compliant member 40 could be adjusted quickly by adding a spacer of the required thickness. The waveguide insert 42 would be allowed to move freely on step pins/dowels that have a dual purpose of alignment pins and vertical axis control to control height needed for waveguide insert to precisely connect to device waveguide port 20. Dowel pin 14 holes in waveguide insert could contain a lubricant to allow smooth movement of the waveguide insert. In FIG. 12, it can be see that the wave guide adapter 24 may have a circumferential recess 52 to receive a winding of the compliant member 42. The wave insert may include a like circumferential land 50 which creates a recess/region just outside the land for a winding of the compliant member 42. Outside of the land 50 and compliant member, a circumferential shield 54 (FIGS. 9, 19) affixed to either the adapter for insert, may provide one more RF shield boundaries. The shield is a coaxial band laid on one of the surfaces forming an outer (extra) ring. It may include one or two parallel concentric conductors embedded into a resilient material which itself may or may not be conductive.

It is possible to create a low pass filter by adjusting the size of the waveguide opening on the adapter 42 relative to the wave port opening 20 on the DUT 30. For example, placing a smaller opening W-band waveguide interface between the E-band waveguide output of the device and the E-band flange mounted to the bottom of the contactor or the PC board that the contactor is mounted to will effectively act as a low pass filter removing in this case the frequency content below 75 GHz. E-band frequency is 60-90 GHz and W-Band is 75-110 GHz. Putting W-band Waveguide between two E-band waveguide parts narrows the frequencies that will propagate to 75-90 GHz.

Just above the waveguide cutoff (lower frequency limit for each waveguide band) results in the best electrical performance in terms of matching and loss according to HFSS modeling. This design would make use of that feature to optimize the performance of the contactor 12 and allow for better and more accurate measurements of the device (DUT).

Some additional features of the disclosure are:

1. A Compliant/adjustable waveguide connection (could be any size or shape of waveguide opening including rectangular, circular, or custom shape) for interface to waveguide inputs and outputs. Most of the figures show only rectangular interface connection but other shapes are possible.

2. Compliant Waveguide interfaces that use different waveguide transitions between bands when frequencies of interest overlap waveguide bands. For example, using smaller opening in the wave guide, allows filtering unwanted lower frequency signals from a larger DUT wave port opening and still having the ability to connect between the compliant waveguide insert and the waveguide adapter, which is used to interface to outside test equipment.

3. To provide good ground path from the compliant waveguide insert to the waveguide adapter that would interface with testing equipment by use of an electrically or RF conductive member that could be a coil/wave spring, array of spring pins or pogo pins, electrically or RF conductive elastomer, compliant/resilient wire mesh, or any other solution that provides signal from a top side interface (waveguide insert) to bottom interface (waveguide adapter).

4. The ability to have a waveguide port and other I/O of Device (pads, leads, or ball, etc.) have same hard stop used for the other pins thus assuring all different types of I/O on the package can be provided with the same low inductance ground connections to improve isolation or crosstalk between different types of I/O on the package (DUT).

5. The use of a compliant conductive member to provide grounding between waveguide insert and waveguide adapter. By using a conductive material for the compliant member, and grounding same, an RF shield is created. A compliant member that is preferably conductive in order to efficiently propagate signals thru the waveguide insert and adapter to test equipment. These conductive members could be wave springs, but could also be a standard spring where less compliance/lower forces is acceptable. The compliant member could be an array of pogo pins or spring pins which are placed side by side to form a ring of "stakes" surrounding the port, conductive elastomer, plurality of conductive wires buried into an elastomer or other material, or could be wires bundled up similar to fuzz button technology and could completely surround the waveguide opening or surround a portion or have one connection per side or face of waveguide opening.

6. The ability to provide improved isolation between the waveguide output and other more standard RF connections by providing raised areas (projecting lands) on the metal housing to provide separation between signals, especially between different types of I/O connections on package.

7. The ability to adjust the concept for different load board thicknesses by adding one of more spacers below the spring in the waveguide adapter and changing the thickness of waveguide insert.

8. The use of dowel pins, for example two such pins, but more could be used, to assure waveguide insert remains coplanar and laterally aligned and can connect with the DUT on all four sides to optimize electrical signal transmission between device and tester.

9. The waveguide insert which interfaces to the DUT and during production testing needs cleaning or even replacement of waveguide insert from time to time. This can be done easily be removing it from the dowel/alignment pins that allow the insert to move uniformly up and down and make connections to the waveguide port on the device.

10. A bump or raised area that in between the compliant member and the waveguide opening in the waveguide adapter that can be formed as a portion of the waveguide adapter metal or could be formed of a gasket or other compliant member is used to improve the ground connection between the waveguide insert and the waveguide adapter to improve isolation, possibly holding the compliant member in place, and to seal off any potential opening that might occur during potentially non-compliant connection between the device under test and the waveguide insert.

11. Using a metal/metalized housing to provide easy access to grounding to provide a low inductance path for RF signals.

12. The ability to control or match waveguide slots with standard industry standard waveguide flanges.

13. The ability to mount test equipment on the bottom of the test contactor away from the hander or the insertion mechanism into the contactor.

14. The ability to use alignment pins or raised or radiused bumps in lieu of pins to help locate the device in the test socket to reduce the effects of placement tolerance, which could be catastrophic for high frequency devices where a quarter wavelength is tenths of a millimeter.

15. Waveguide inserts could have protruding/projecting land members to fit inside the waveguide opening in the DUT, in an interlocking or overlapping wall to wall arrangement, to further control the signal flow from the device thru the test contactor to the waveguide ports that would be routed to test equipment. Insert portion of the waveguide insert that would penetrate the opening in the device would have sufficiently thin walls to allow propagation in a higher frequency waveguide band.

16. The waveguide cutout could be filled with dielectric material and/or include features to filter or optimize device performance.

17. EMI (electromagnetic interference) gasketing or a specially designed o-ring could be used to assure metal to metal contact inside walls and a contactor with walls around the waveguide opening on the device. It is preferable that the long waveguide slot is making solid contact otherwise E-Fields will not propagate from the device through the test contact with the waveguide slot top test instrumentation.

18. The disclosed concepts will also work for waveguide slot on the side of the device, not just the top. An e alignment plate can be used to adjust the device to make contact with the contactor waveguide insert. The part could be aligned with dowel pins and seated on the hard stop such that the waveguide opening on the device would be in contact precisely with the opening on the contactor.

Turning back to the figures, FIG. 1 is a bottom view of a device DUT 30 (IC) with a high frequency port 20. In this case, it is a rectangular wave port with rounded corners.

Figure 13:
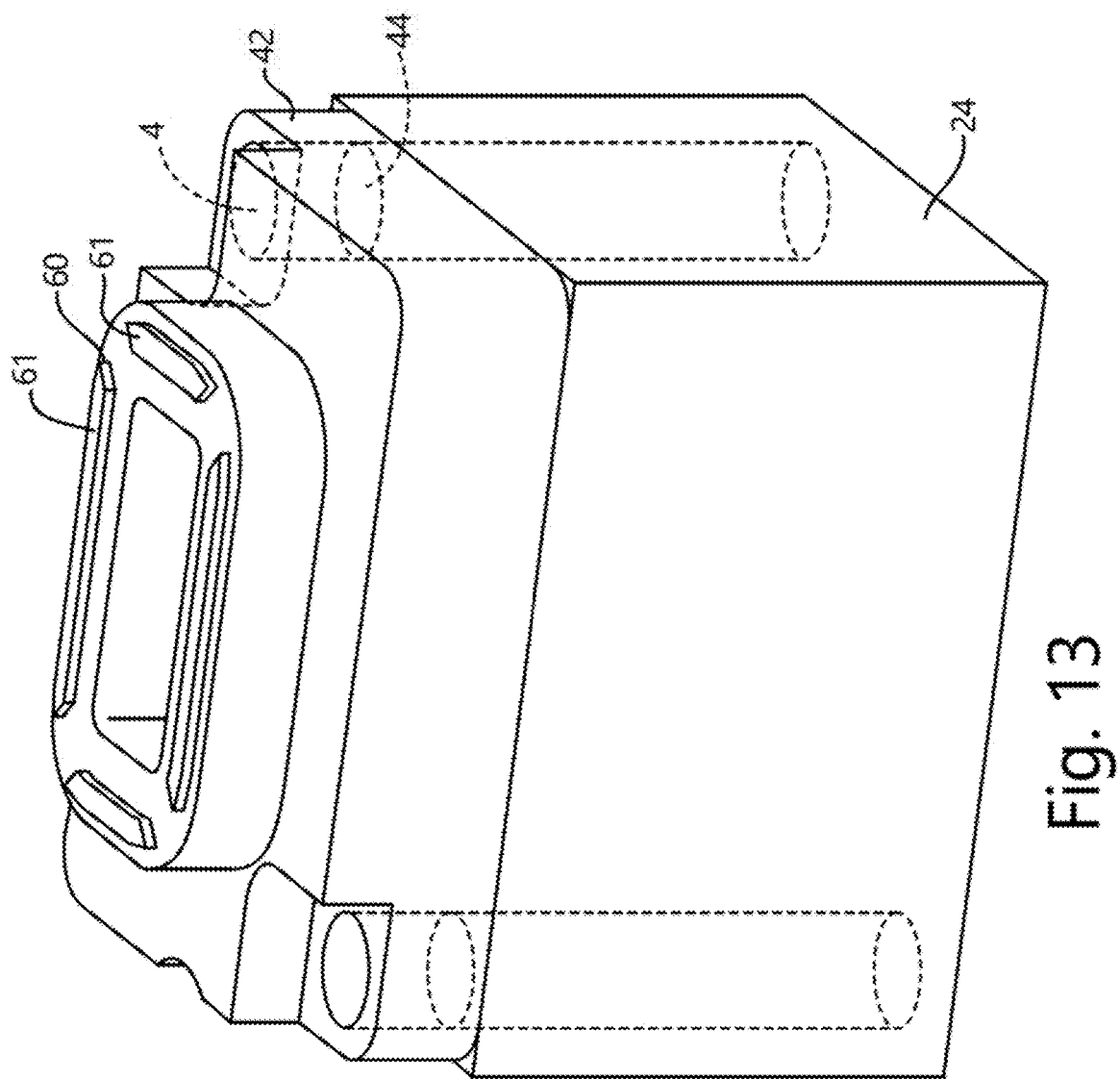
FIG. 13 is a semi-transparent close up perspective view of the insert adapter in FIG. 11.

FIGS. 2-7 illustrate various views of a housing/alignment plate 22, made of a metal or dielectric material such as with metalized coating, a waveguide adapter 24 and waveguide insert 42, pin holder inserts 26 which are configured to receive contact pins 28 (shown above the inserts). These inserts and pins are fully described in U.S. Ser. No. 14/211, 974, which is incorporated herein by reference. They represent other contact pins which engage the low frequency contacts on the DUT 30 and are often in addition to the high frequency (HF) port and waveguide described below. Dowels 14 or other means, such as alignment bumps described herein are used to join the top and bottom portions of the test housing and maintain alignment. A coaxial shield 54, described below, is also shown in FIGS. 9, 13 Guide pins 44 (FIG. 10) are used to maintain the waveguide insert and the waveguide adapter in vertical alignment as the waveguide insert slides up and down.

Figure 9:
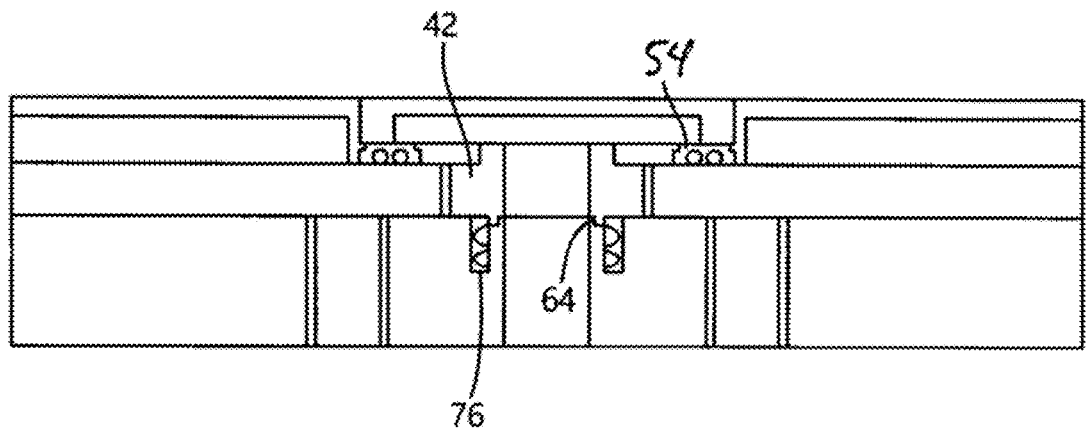
FIG. 9 is a plan view with portions broken away of the subject matter of FIG. 6.
Figure 10:
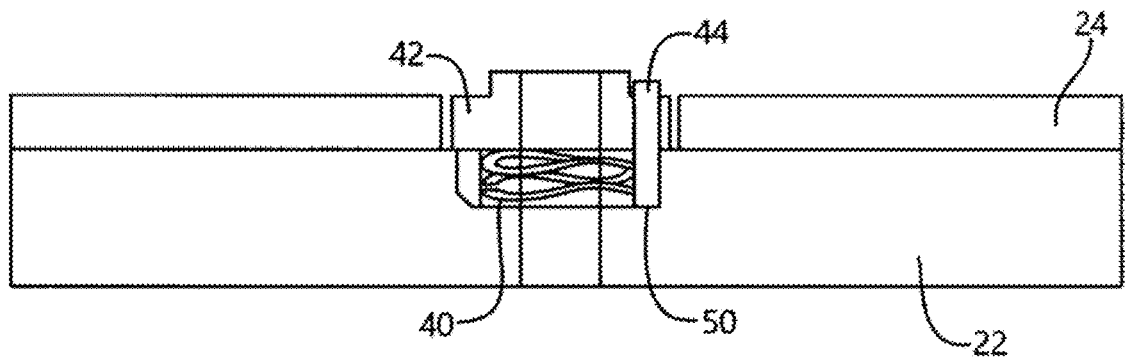
FIG. 10 is view like FIG. 9 with additional detail.
Figure 11:
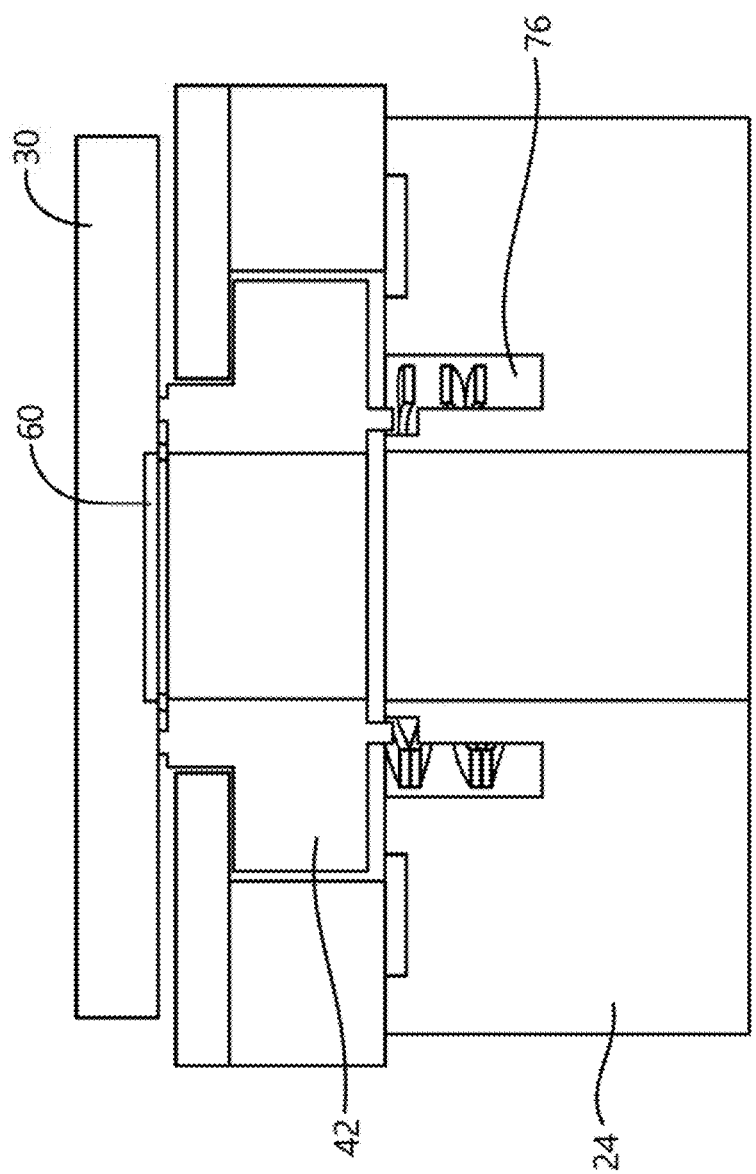
FIG. 11 is a close up side sectional view of the subject matter in FIG. 10.

Looking at FIG. 10 for the best view, the compliance member 40, which is a resilient member which serves as a part of the waveguide path, extends from a recess 50 in the waveguide adapter 24 and abuts the waveguide insert 42. Then insert may include a telescoping element which allows it travel up or down in response to engagement with the waveguide port on the device. As can be seen in FIGS. 9-12, the waveguide insert has a ring/circumferential shaped opening 60 which serves to abut a similarly shaped wave port opening on the DUT (device) preferably by surrounding the it's outer circumference of the DUT port, abutting edge to edge or abutting by inserting within the DUT wave port. See FIG. 1. Projections/lands 61 may be used to mate with similar lands on the DUT. The shape can vary from circular to merely portions of a circumference, not necessarily circular. Lands or protrusions 61 are sized to engage like recesses in the DUT so that the two will closely mate during test.

In FIG. 9 it can be seen that the waveguide insert has an extension/projection land or telescoping element 64 which is received in a like recess in the waveguide adapter. Note that the projection 64 is shown on this embodiment of the adapter, but it is understood that the projection could originate from the waveguide instead and is considered part of this invention regardless of which part it emanates from.

Typically this extension is ring shaped so that as the waveguide adapter moves up and down, there is an RF shielded path from the device to the bottom of the waveguide adapter or load board. In the preferred embodiment, the waveguide adapter, the compliant member and the waveguide insert are metal; metallic coated or in some way can contain the RF signal and provide a solid return path to and from the DUT. The compliant member is also metallic or metal coated and the spacing between turns of the coil is sufficiently close that it can provide a good connection to the RF signal.

In FIG. 13 the insert adapter 42 is shown in part.

Figure 15:
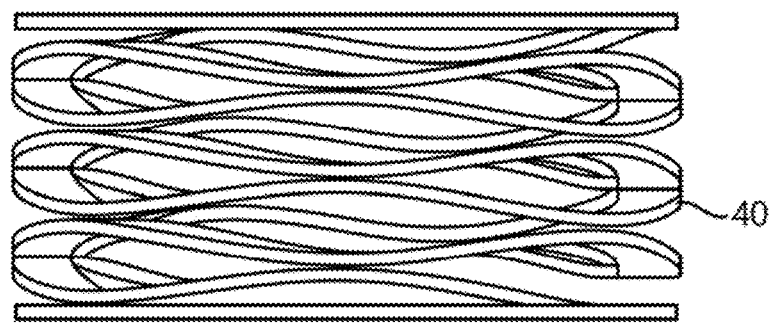
FIG. 15 is a side plan view of a compliant member.

The compliant member 40 as shown in FIG. 15 can be a single or double helix, a mesh, screen or other shield with sufficient resilience to bias the waveguide insert up against the DUT so that a tight RF connection is made and there is no discontinuity in the field path. A conductive elastomer will also work. It preferably has a planar top and bottom ring for maximum shielding and electrical contact.

Figure 16A:
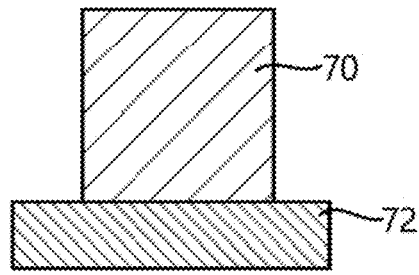
FIG. 16a and FIG. 16b are side and top plan views respectively of an alternate embodiment of a compliant member made of elastomeric conductive material with a base of conductive material.
Figure 16B:
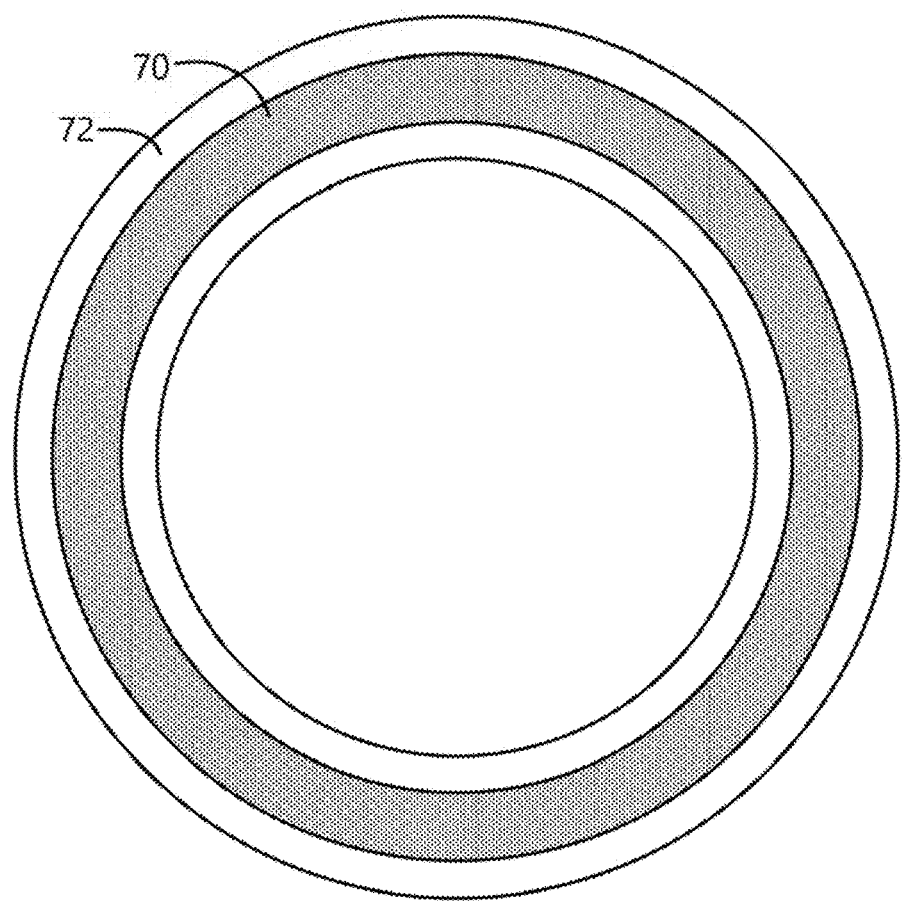

FIGS. 16a and 16b illustrate an alternate embodiment of a conductive elastomer as a compliant member. In place of a spring 40, a solid resilient elastomeric metallic or metal coated cylinder 72 is coaxially aligned with a base member or conductive sheet 72 such as resembling a washer. The sheet resides as the bottom of the recess 76 while the cylindrical section replaces the spring/compliant member. As a solid cylinder, it provides complete RF containment.

In operation, port 20 on DUT 30 mates with pins 28 and simultaneously with the waveguide adapter 24 holds the wave guide insert 42 which is biased up against port 20 by the resilience of the compliant member 40. The bias force of the compliant member allows the insert 42 to float as needed to adapt to the height of the port 20. Remember that pins 28 must make solid contact with the DUT pads or pins and the height of the wave port 20 may vary from DUT to DUT. Thus the compliance (i.e. the ability of the waveguide insert to float or adapt in its up/down on an axis orthogonal to the plane of the DUT, means that the height variation can be "complied with" by this axial float.

There is also a method of maintaining a RF shield path between a DUT and test device, where the housing is capable of up and down movement in response to insert of the DUT into the housing. The method uses the construction above, where a two part waveguide is moveably joined by a shielding or conductive elastomeric resilient body which biases the wave adapter into engagement with the DUT but keeps the path to the test housing fully shielded against RF leakage. The adapter may include a telescoping element which provides slides within a recess in the housing to maintain an RF shield during movement/travel.

Calibration.

It may be desirable to calibrate the test socket without having an actual chip inserted therein. Furthermore, it is very desirable to calibrate/align the test socket without the need to remove it from the load board. Instead, it is possible to calibrate the RF wave port with a dummy device which accommodates a secondary input of RF which will pass through the dummy device and into the RF wave port receptor on the test socket.

Figure 3:
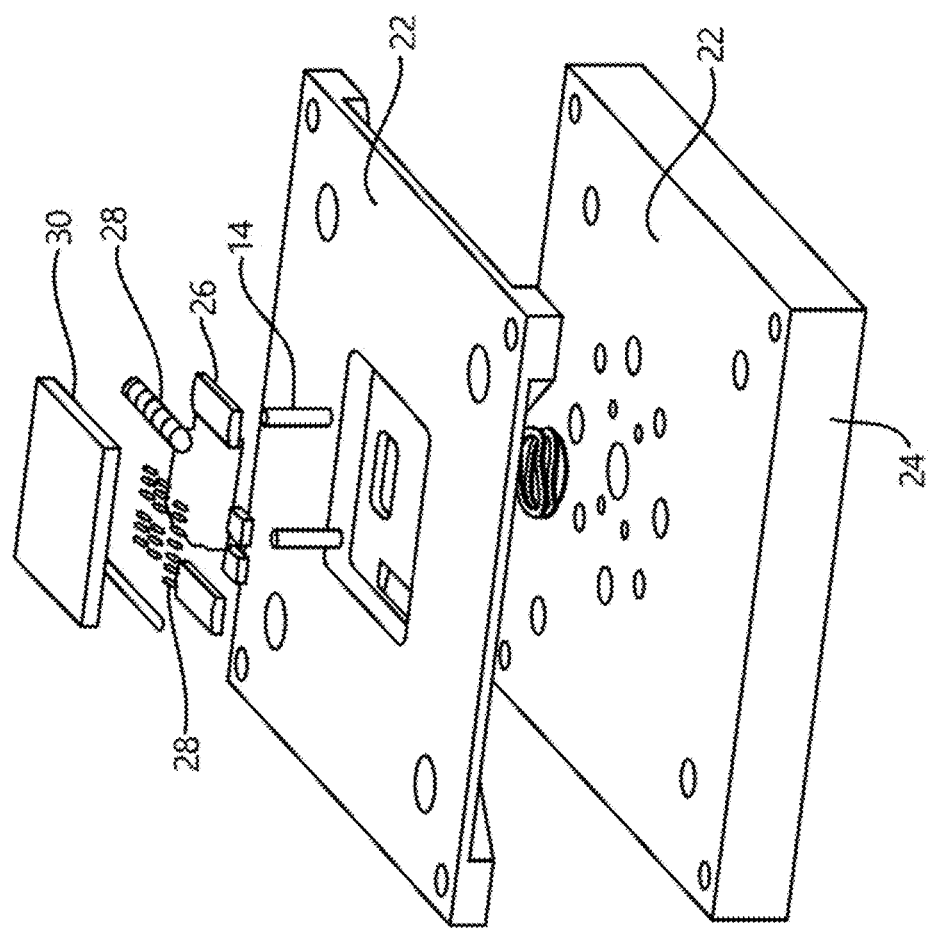
FIG. 3 is a top perspective exploded view of the housing and DUT in FIG. 2.
Figure 4:
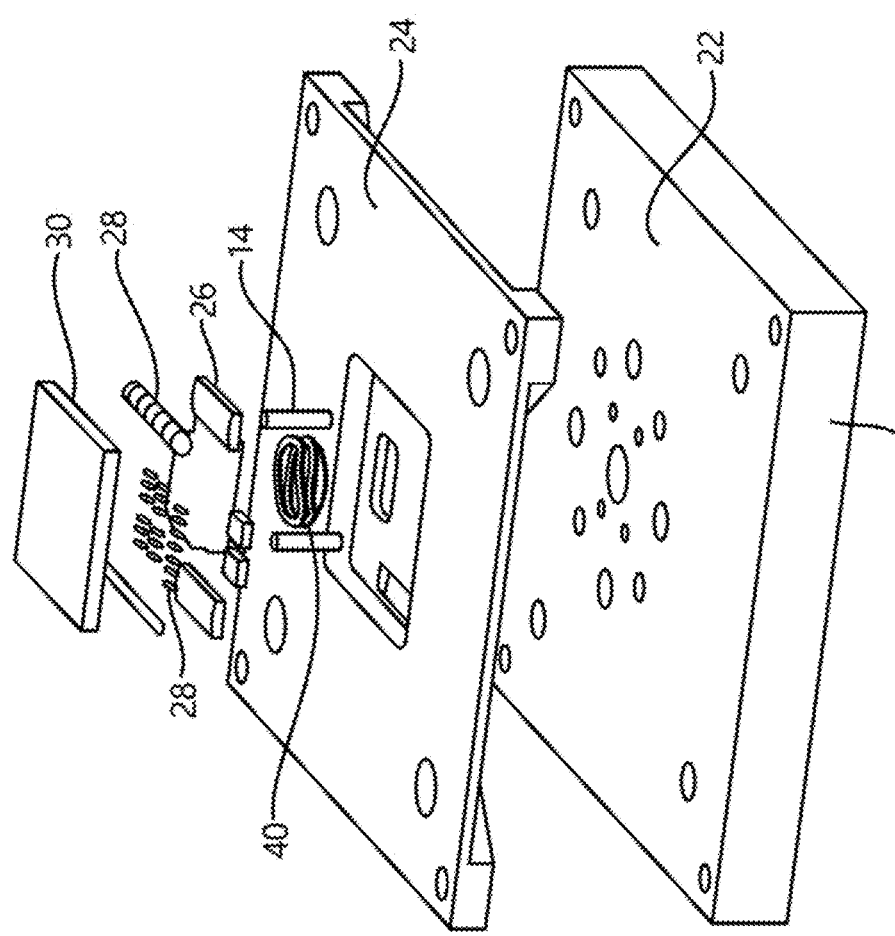
FIG. 4 is a view like FIG. 3 with the compliance member shown above the housings.
Figure 5:
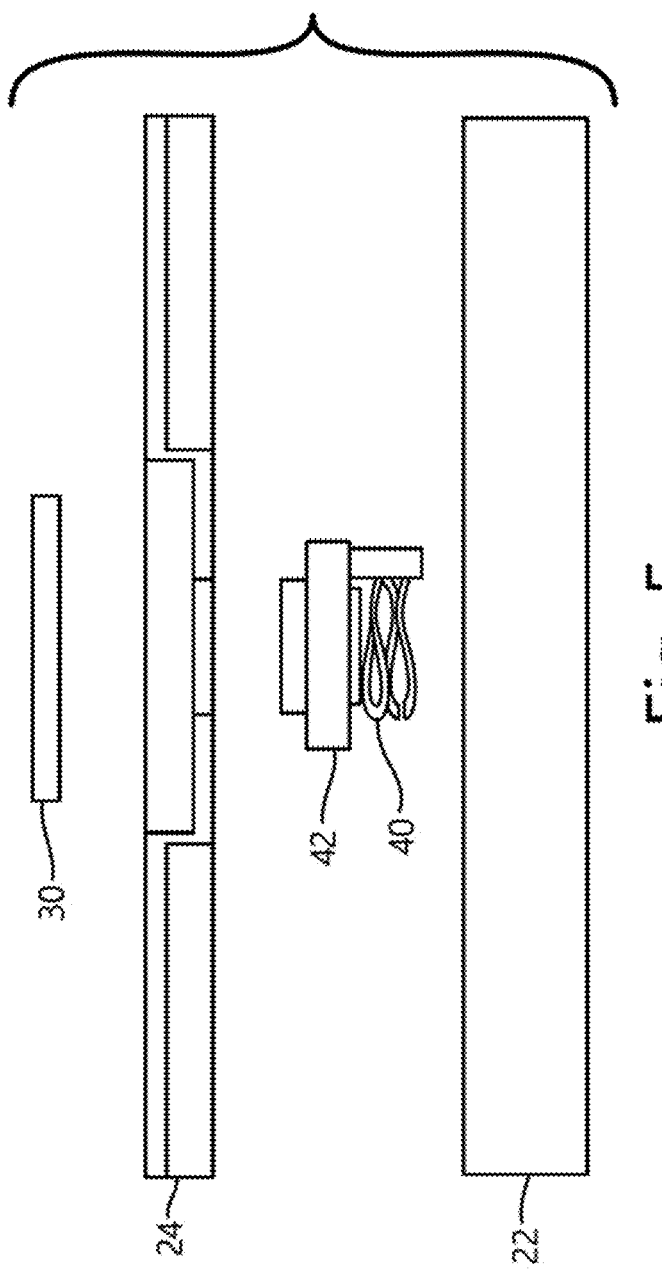
FIG. 5 is another exploded view with parts shifted laterally for clarity of the subject matter in FIG. 4.
Figure 6:
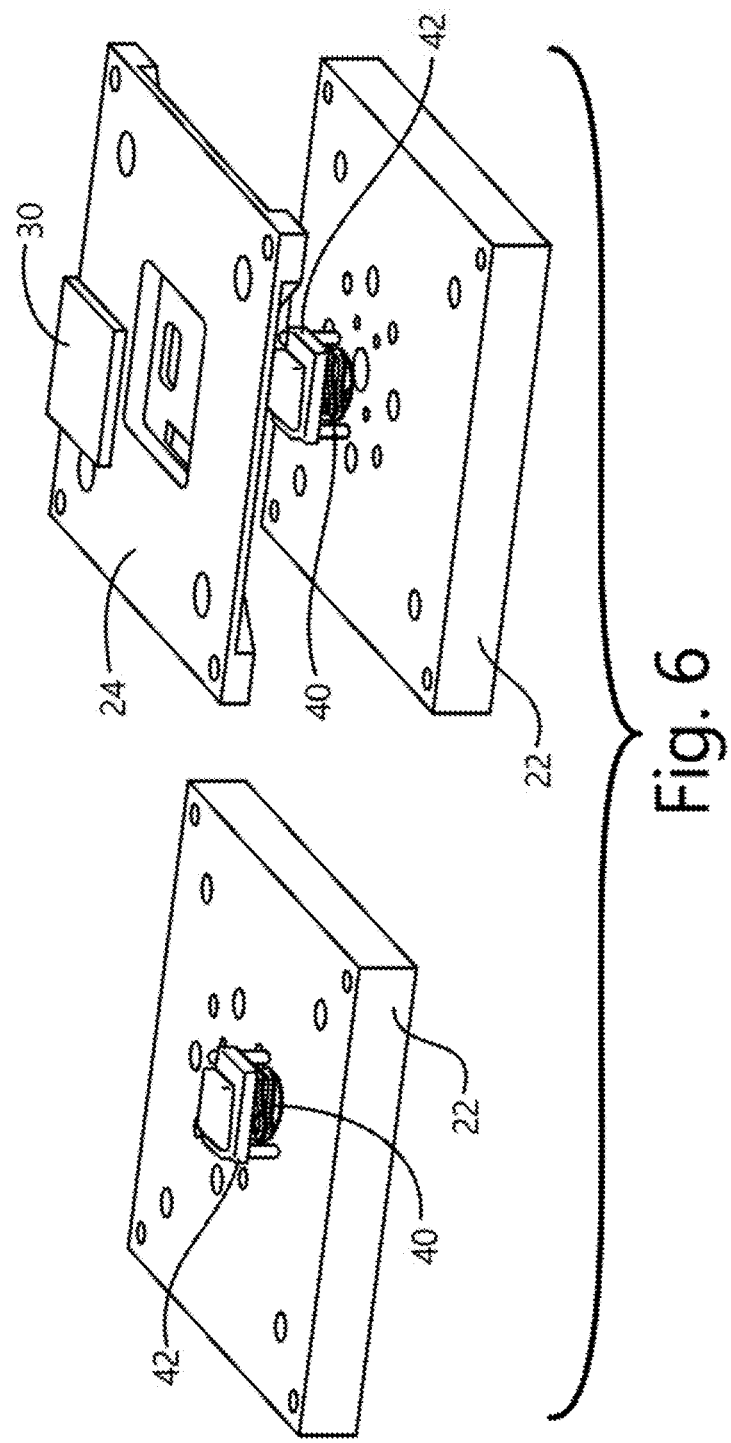
FIG. 6 is a side-sectional exploded view of the subject matter in FIG. 4.
Figure 7:
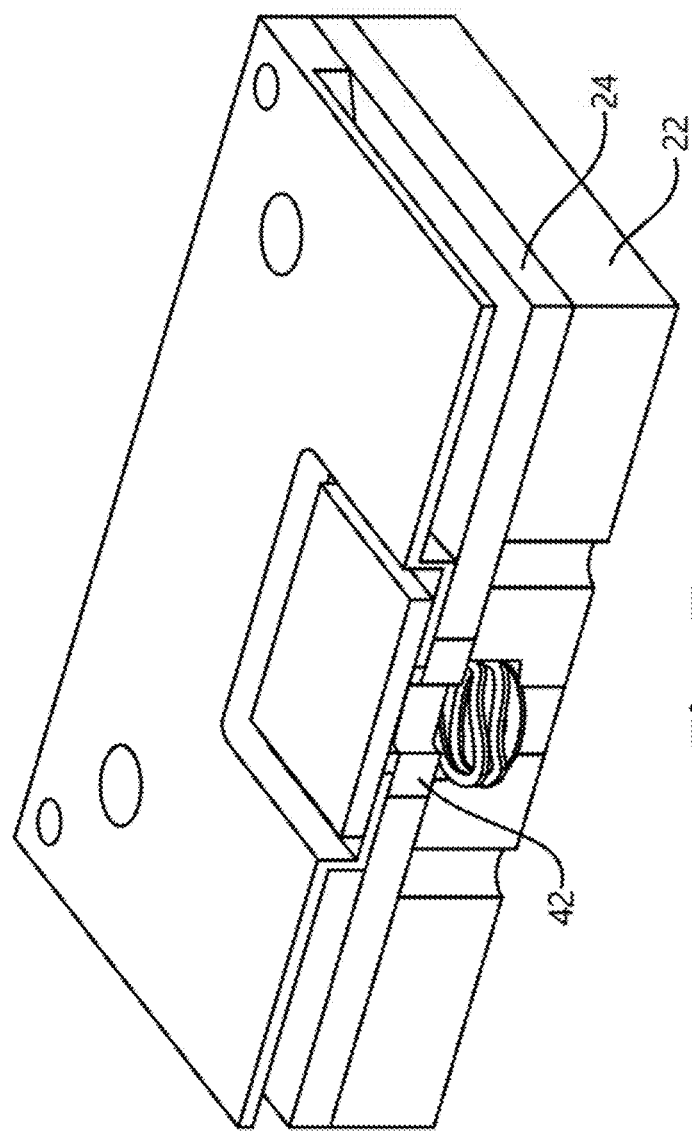
FIG. 7 is a sectional perspective view of a housing and a DUT with the top cover removed.
Figure 8:
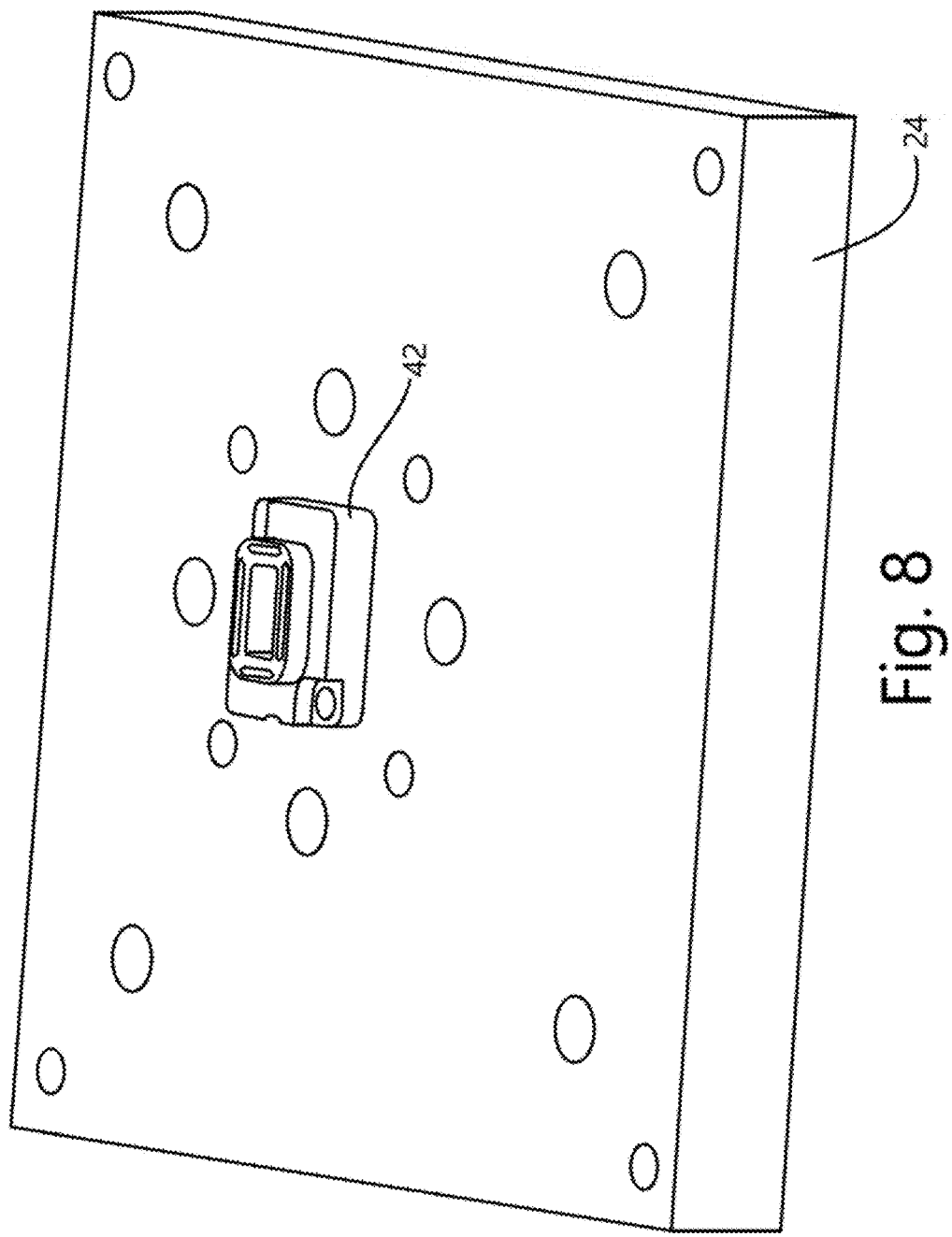
FIG. 8 is a partially transparent top perspective view of the subject matter in FIG. 2 with dowel housing connector pins shown.
Figure 17:
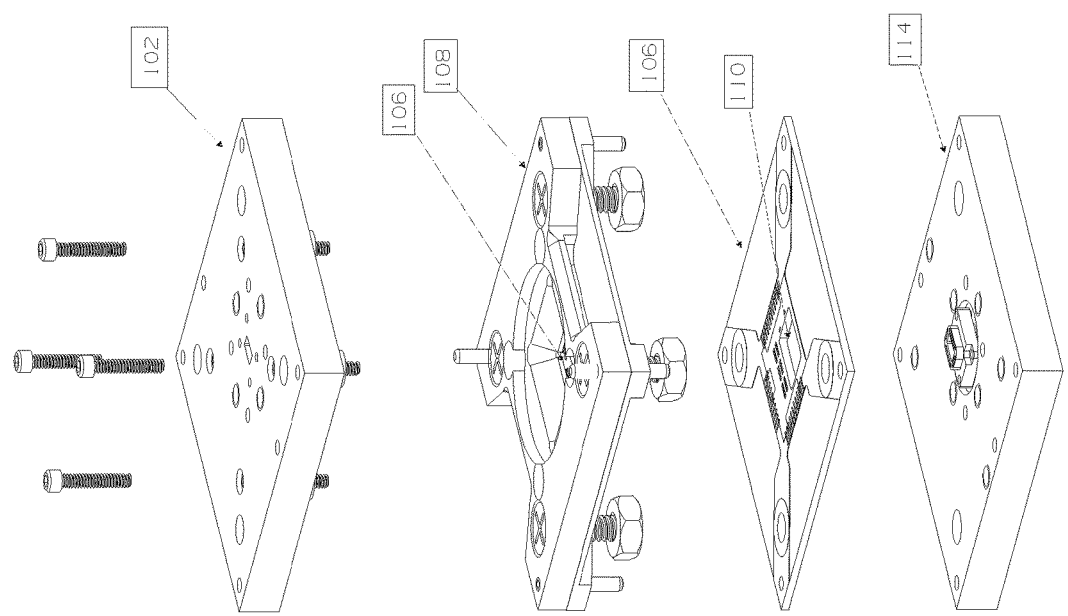
FIG. 17 is a top perspective exploded view of test housing with a calibration wave guide device on top.
Figure 18:
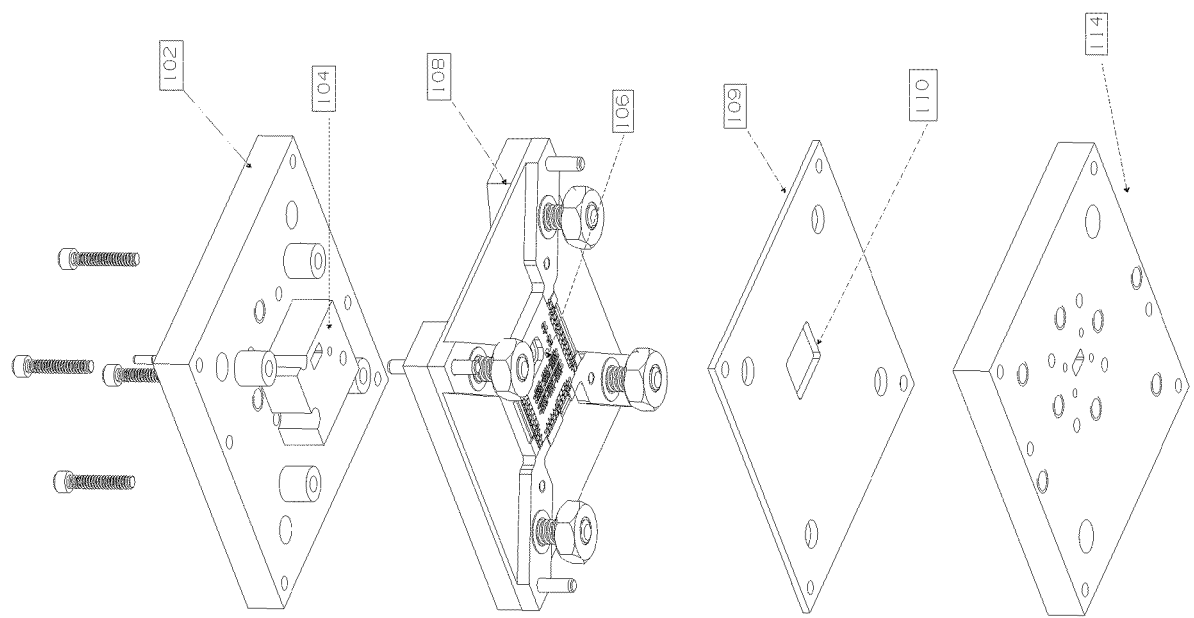
FIG. 18 is an exploded view like FIG. 17 except a bottom perspective.
Figure 19:
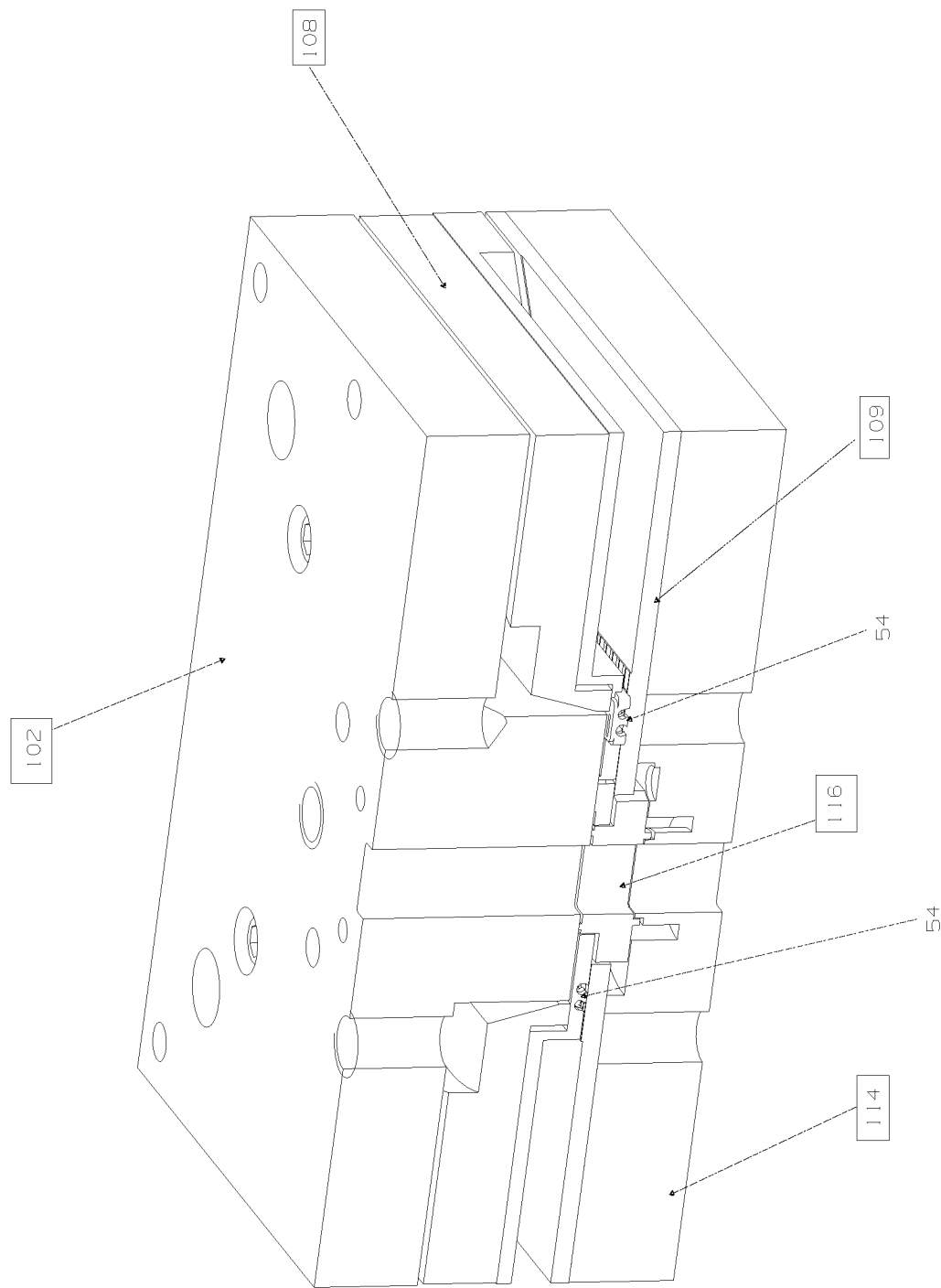
FIG. 19 is a sectional side perspective view of a test housing with a calibration wave guide device on top.

Turning to FIGS. 17-19, which are exploded views of a test socket/housing similar to FIG. 3, except in place of a Device, a dummy DUT or calibration waveguide device 102 has been created. The calibration device 102 includes a wave port 104 which mates with a similar port 106 in the alignment plate 108. The load board 109 likewise has a similar RF wave port 110 aligned with the above mentioned ports. The bottom plate 112 is a waveguide 114. In FIG. 19, the wave guide insert 116 can be seen between the waveguide adapter and passing through the load board 109.

During calibration, an RF signal of known parameters is supplied to the calibration device 102. This signal passes through the various aligned ports until the signal reaches the waveguide adapter 114 where circuitry is provided to test the RF signal parameters. Because of misalignments and losses, there will be a differential between the RF input and RF signal measured at the adapter. The adapter is then calibrated to account for these losses. Once calibrated, the RF output from actual DUTs tested will produce a measurable output which can be compared to the calibration standard.

A method of maintaining a RF shielding path between a DUT and test housing device is also disclosed having any or all of the following steps:

1) providing a housing having an orthogonally slideable waveguide contact member or adapter capable of up and down movement in response to inserting of the DUT into the housing, 2) forming a two part housing of an upper adapter part and a lower waveguide part, the upper part configured to engage a port on the DUT at its top end and slideably engage the waveguide at its lower end, while maintaining an RF shielded path during sliding;

3) providing or inserting an elastomeric conductive compliant member in contact with or within a recess said waveguide contact member to bias the member part into said DUT port while maintaining an RF shield from the DUT wave port to the housing.

The description of the invention and its applications as set forth herein is illustrative and is not intended to limit the scope of the invention. Variations and modifications of the embodiments disclosed herein are possible and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

We claim:

1. A test socket for making electrical connection between an integrated circuit device under test (DUT) having a high frequency (HF) wave port located on the DUT at a height above the surface of the DUT, and a plurality of contact points on the surface of the DUT, comprising:

a housing having a wave guide adapter portion and wave port insert portion, said wave port insert portion being in up and down sliding engagement with the housing and the DUT wave port and having a bottom surface sized to engage said bottom of said housing, said housing being configured to bring said wave port insert portion into proximate contact with said DUT wave port;

said wave guide adapter portion including a HF shielding elastic biasing compliance member positioned to bias said wave port insert portion resiliently into said wave port on the DUT, so that when the housing is brought adjacent to the DUT, contact is made with the DUT and the wave guide insert portion makes biased contact with the DUT wave port, despite variations in the height of the wave port above the surface of the DUT.

2. The test socket of claim 1, wherein the HF shielding elastic bias compliance member is a resilient metal spring.

3. The test socket of claim 1, wherein the HF shielding elastic bias compliance member is a resilient metal coated spring.

4. The test socket of claim 1, wherein the HF shielding elastic bias compliance member is a resilient helical wound conductive spring.

5. The test socket of claim 1, wherein the HF shielding elastic bias compliance member is a resilient a spring formed into a double helix and is electrically conductive.

6. The test socket of claim 1, wherein the wave port insert portion includes a circumferential recess for receiving a portion of said HF shielding elastic bias compliance member.

7. The test socket of claim 1, wherein the housing includes a circumferential recess for receiving a portion of said HF shielding elastic bias compliance member.

8. The test socket of claim 1, wherein the wave guide adapter portion includes a coaxial shield member located on a surface of said wave guide adapter portion facing said DUT coaxially with said HF shielding elastic bias compliance member; said shield joining said DUT and wave guide adapter portion when the two are brought together.

9. The test socket of claim 1 wherein said HF shielding elastic bias compliance member is a cylindrical conductive elastomeric tube.

10. The test socket of claim 1 wherein the wave port on the DUT has an inner periphery and wherein said wave port insert portion extends into said inner periphery.

11. The test socket of claim 1 wherein said wave port adapter portion includes a plurality of apertures and the housing includes dowel pins sized to be slideably received within said apertures, whereby the wave guide adapter portion may move along said dowel pins in response to contact with the DUT wave port.

12. The test socket of claim 1 wherein said HF shielding elastic bias compliance member includes a plurality of stacked non planar resilient rings.

13. The test socket of claim 1 wherein the HF shielding elastic bias compliance member includes a plurality so spring pins extending from aligned side by side into a circumferential resiliently supporting the wave guide adapter portion.

14. The test socket of claim 1 wherein said HF shielding elastic bias compliance member is a cylindrical conductive elastomeric tube having a bottom edge and a conductive circular washer joined thereto to create a base to said tube.

15. A test socket, attachable to a load board, for making electrical connection between an integrated circuit device under test (DUT) having connection points and a high frequency (HF) wave port, comprising:
a housing having a top adapter portion and bottom guide portions, said top portion being in up and down sliding engagement with DUT wave port and having a bottom surface sized to engage in said bottom guide portion so that the top and bottom overlap during up and down movement therebetween,
a shielding elastic bias element engaging said top and bottom portions said top adapter portion to provide a continuous shield between the top and bottom portion and for simultaneously biasing the top portion against said DUT.

16. A test socket for making electrical connection between an integrated circuit device under test (DUT) having a high frequency (HF) wave port located on the DUT at a height above the surface of the DUT, and a plurality of contact points on the surface of the DUT, comprising:
a housing having a wave guide adapter portion and wave port insert portion, said wave port insert portion being in vertical sliding engagement with the housing and the DUT wave port and having a bottom surface sized to engage and be at least partially received within said bottom of said housing; said housing being configured to bring said wave port insert portion into proximate contact with said DUT wave port;
said wave guide adapter portion including a HF shielding elastic biasing compliance member positioned to bias said wave port insert portion resiliently into said wave port on the DUT, so that when the housing is brought adjacent the DUT, contact is made with the DUT and the wave guide insert portion makes biased contact with the DUT wave port.

\* \* \* \* \*